United States Patent [19]
Katoh et al.

[11] Patent Number: 5,250,839
[45] Date of Patent: Oct. 5, 1993

[54] MULTI-LAYER LEADFRAMES, ELECTRICALLY CONDUCTIVE PLATES USED THEREFOR AND PRODUCTION OF SUCH CONDUCTIVE PLATES

[75] Inventors: Kazunori Katoh; Yuji Yamaguchi, both of Tokyo; Hiromichi Suzuki, Kodaira; Takayuki Okinaga, Kodaira; Takashi Emata, Kodaira; Osamu Horiuchi, Kodaira, all of Japan

[73] Assignees: Dai Nippon Printing Co., Ltd.; Hitachi, Ltd.; Hitachi VLSI Engineering Corporation, Japan

[21] Appl. No.: 765,146

[22] Filed: Sep. 25, 1991

[30] Foreign Application Priority Data

Sep. 26, 1990 [JP] Japan ............................ 2-256091
Sep. 26, 1990 [JP] Japan ............................ 2-256092

[51] Int. Cl.⁵ ...................... H01L 23/48; H01L 23/50
[52] U.S. Cl. .................................... 257/666; 257/669; 257/674
[58] Field of Search .................... 357/70, 68, 71; 257/666, 669, 674, 773, 776

[56] References Cited

U.S. PATENT DOCUMENTS

4,796,078 1/1989 Phelps, Jr. et al. ............... 357/68
4,994,936 2/1991 Hernandez ........................ 357/74

OTHER PUBLICATIONS

"Plane Electrical Enhancement"-IBM Technical Disclosure Bulletin-vol. 32 No. 10A Mar. 1990, pp. 85-86.

Primary Examiner—Rolf Hille
Assistant Examiner—S. V. Clark
Attorney, Agent, or Firm—Dellett, Smith-Hill and Walters

[57] ABSTRACT

A multi-layer leadframe according to this invention is formed by laminating on a leadframe body an insulating layer and an electrically conductive layer in this order. The electrically conductive plate includes a planar portion and a given number of terminal portions extending therefrom, said planar portion extending across said insulating layer laminated on said leadframe body. The planar portion is made thinner than the terminal portions. A thin portion of this planar portion is formed by an etching technique, and at least a part of the terminal portions of the electrically conductive plate is fixedly connected with an inner lead of the leadframe body.

12 Claims, 7 Drawing Sheets

MULTI-LAYER LEADFRAMES, ELECTRICALLY CONDUCTIVE PLATES USED THEREFOR AND PRODUCTION OF SUCH CONDUCTIVE PLATES

BACKGROUND OF THE INVENTION

The present invention relates generally to leadframes that are parts for assembling a resin mold type of semiconductor devices and more particularly to leadframes used for semiconductor devices needed to operate at high speed and have high heat dissipation. This invention is also directed to electrically conductive plates used with such leadframes and a method for making them.

In general, a resin mold type of semiconductor packages have some advantages of being capable of being mass-produced at low costs and light in weight. When comparing with ceramic packages, however, they offer some serious problems. Among them:

They are poorer in heat dissipation.

They are inferior in electrical properties with respect to noise.

When constructed in a multi-pin configuration, they increase in size with an increase in lead length, resulting in an increase in inductance, interline capacity and so on. Never until now, therefore, have the resin mold type of semiconductor packages been available for semiconductor elements needed to operate at high speed and have high heat dissipation.

Figure 12:
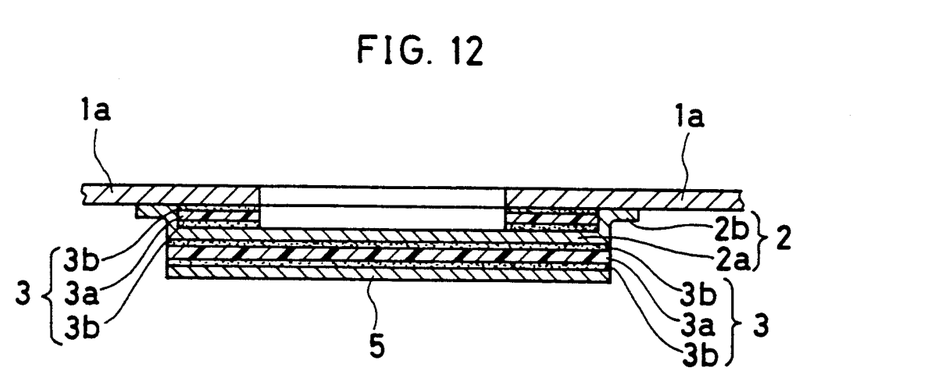
FIG. 12 is a sectional view of a conventional leadframe.

In recent years, a sort of package which is a resin mold type of package but nonetheless has the merits of a ceramic package has been proposed in Japanese Provisional Patent Publication No. 63(1988)-246851. This resin mold type of packages makes use of a multi-layer structure of leadframe wherein, as illustrated in FIG. 12, a power source plate 2 built up of a flat metal plate is joined to an inner lead portion 1a of a leadframe body 1 with a laminating adhesive film 3 including adhesive layers 3b and 3b on both sides of a polyimide-based material 3a and an ground plate 5 is additionally joined to the power source plate 2 with the same laminating adhesive film 3.

Figure 13A:
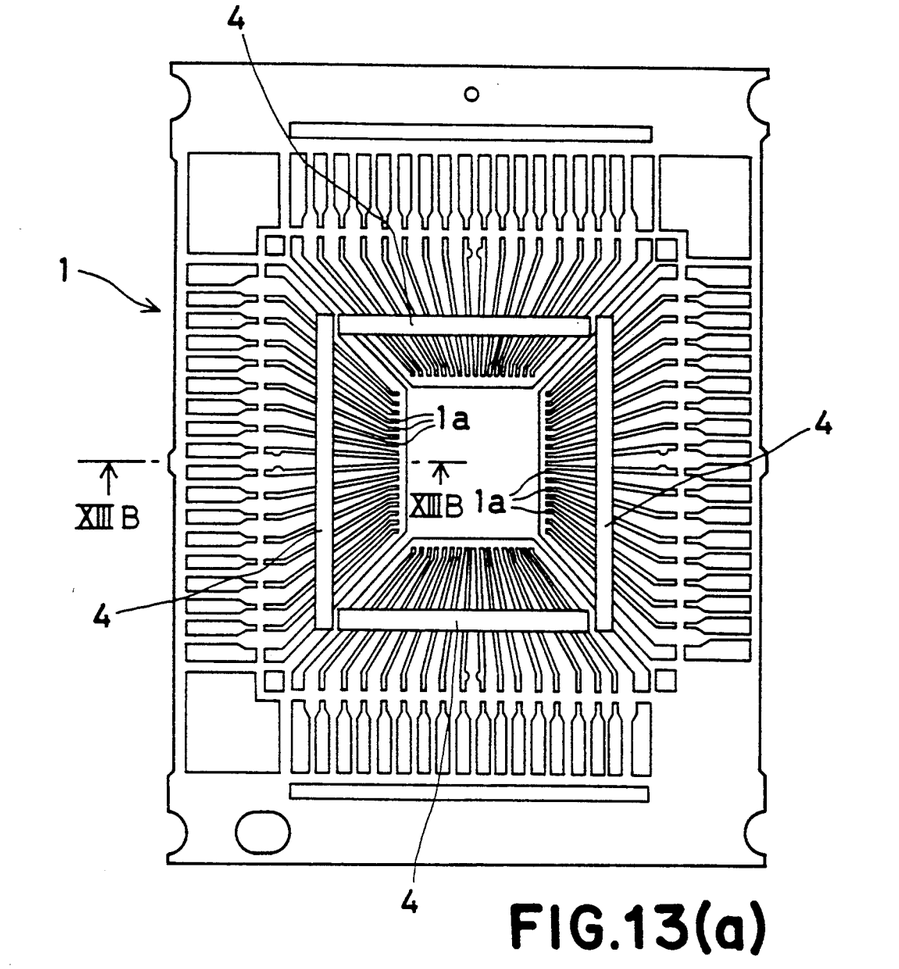
Figure 13B:
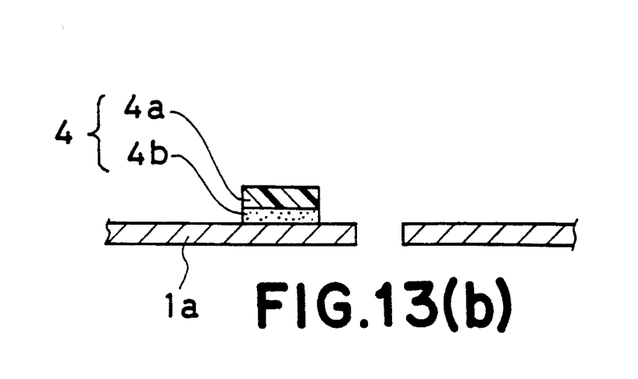

In that case, the conventional type leadframe 1 is provided, as shown in FIG. 13, for example, with a given number of outer leads 1b electrically connected to an external electric circuit, a given number of inner leads 1a furnished continuous to the outer leads 1b and electrically connected to a plurality of electrodes of a mounted semiconductor element through conductive wires, and a die pad 1c to mount the semiconductor element lead portions 2b and 2b located on the power source plate 2 are connected with the inner lead 1a by press-bending the flat plate. Although not illustrated, the ground plate 5 is likewise provided with lead portions, which are in turn connected with the inner lead 1a. Generally, connection of the power source plate 2 with the inner lead 1a is achieved by electrical resistance welding or laser welding. The junction is now needed to have a minute area with a multi-pin type of leadframe in mind. The above-mentioned problems are solved by using this multi-layer structure of leadframe.

With the conventional multi-layer leadframe set forth in the above-mentioned patent publication, however, difficulty is encountered in keeping the interlayer thermal behavior well-balanced, because a plurality of power source plates are laminated in place with an adhesive-containing polyimide film. This may possibly cause a warp of the leadframe under the influences of heat generated from semiconductor elements and other factors, which may then give rise to package cracking or voids during resin molding.

In most cases, the adhesives on both sides of the polyimide film used must be so after-cured that the reliability of the leadframe can drop due to contamination by outgassing.

Furthermore, when constructed in a multi-pin configuration, leadframes increase in lead length simultaneously with a decrease in lead's sectional areas; the leads are likely to deform as during transportion of the leadframes. To avoid this, a tape 4 for taping purposes, which has an adhesive layer 4b on one side of a linear polyimide-based material 4a as shown in FIG. 13, is generally laid across inner leads 1a of a leadframe 1 and thermally bonded and fixed thereon—called a taping technique, just after the plating step of the production stage of leadframes.

Furthermore, usually applied to multi-pin leadframes made by an etching technique is a so-called "tip-cutting" wherein the lead tips are previously connected to each other with die pads and etching patterns, and they are cut off after taping, thereby preventing deformation of the leads and assuring the flat widths of the leads. Undeniably enough, this contributes to improvements in the yield of multi-pin leadframes produced.

The present applicant has already filed a patent application (Japanese Patent Application No. 1(1989)-253244) for a multi-layer leadframe wherein the region of a leadframe body to be bonded is divided into plural segments to reduce adhesive areas so as to cope with or limit the occurrence of voids or the contamination of the leadframe due to gases outgassing from the adhesive during resin molding.

However, the multi-layer leadframes set forth in this Patent Application No. 1-253244 and the aforesaid Japanese Provisional Patent Publication No. 63-246851 use adhesives in no small quantities; they are all far from providing a complete solution to contamination by outgassing.

A careful choice of adhesives should also be made in consideration of how they transmit thermal influences or loads or how they transmit ultrasonics when they are used, because semiconductor elements and leads are connected together by means of known wire bonding. For this reason, for instance, costly polyimide-based adhesives must be used as the adhesives. In addition, after-cure and incidental steps that are unnecessary steps are often needed, thus making the entire process complicated and incurring cost rises.

Furthermore, conventional leadframes rely upon inexpensive adhesives for the lamination of power source plates as taping adhesives when carrying out the aforesaid taping, which again incur considerable expense and have an adverse influence or reliability.

Still furthermore, for all the aforesaid multi-layer leadframes, die pad-free, exclusively designed leadframe kits should be used to laminate power source plates thereon. For this reason, usual multi-pin, rather than multi-layer, leadframe kits cannot be applied to the aforesaid multi-layer leadframes; they cannot be used to make packages commensurate to high-speed semiconductor elements, resulting in cost increases.

SUMMARY OF THE INVENTION

An object of this invention is to provide a greatly reliable and less costly multi-layer leadframe in which which a usual multi-pin, rather than multi-layer, leadframe body is used to prevent package cracking due to a warp of the leadframe and reduce contamination by outgassing.

According to one aspect of this invention, this object is attained by the provision of a multi-layer leadframe including a leadframe body and an insulating layer and an electrically conductive plate laminated thereon in this order, characterized in that the conductive plate includes a planar portion and a given number of lead portions extending therefrom, said planar portion extending across said insulating layer laminated on said leadframe body and at least a part of said lead portions being fixedly connected with an inner lead of said leadframe body.

In the thus assembled multi-layer leadframe, the insulating layer provided on the inner leads by a taping technique extends across the conductive plates with only the lead portions thereon being connected at at least one position with the inner leads. Thus, the multi-layer leadframe according to this invention suffers no thermal warp, unlike conventional leadframes in which electrically conductive plates are laminated all over the surface through adhesive layers. In addition, this invention dispenses with such costly adhesives as heretofore used for the lamination of electrically conductive plates; it is possible to reduce or eliminate contamination due to gases outgassing from the adhesives. Furthermore, the multi-layer leadframe according to this invention costs relatively little, because an ordinary multi-pin, rather than multi-layer, leadframe body can be used.

According to another aspect of this invention, there is provided an electrically conductive plate to be laminated on a leadframe body, characterized in that it is built up of a planar portion and a given number of lead portions extending therefrom and at least partly connected with an inner lead of the leadframe body, said planar portion being thinner than said lead portions.

The thus built-up electrically conductive plate according to this invention is made so thin in the planar portion that connecting lead portions can be provided thereon without recourse to press bending.

According to a further aspect of this invention, there is provided an electrically conductive plate as referred to in the second aspect, characterized in that said given number of lead portions comprise two lead portions to be connected with the same inner lead, said two lead portions being located such that the moments of right and left planar segments due to their own weights are equivalent to each other with respect to a common axial line extending through said two lead portions.

In the thus constructed conductive plate according to this invention, the geometry of the planar portion is determined such that the moments of right and left planar segments due to their own weights are well balanced with each other with respect to a common axial line extending through the two connecting lead portions; the electrically conductive plate can be so set up and stabilized that it is unlikely to fall down during positioning, thereby increasing the productivity of multi-layer leadframes using the electrically conductive plates according to this invention.

According to a still further aspect of this invention, the aforesaid conductive plate is characterized in that thermal stress absorber means is provided between said lead portions and said planar portion.

In the thus constructed conductive plate according to this invention, a zigzag- or hole-form of thermal stress absorber means is provided between the planar portion and the connecting lead portions; this assures that disparity in thermal behavior caused as by welding can be absorbed.

According to a still further aspect of this invention, there is provided a method for producing an electrically conductive plate, characterized in that a thin portion of its planar portion is formed by an etching technique.

According to this method wherein the planar portion is made thin by etching, not only is it assured that demand for fine processing of junctions can be met, but it is also possible to produce electrically conductive plates more accurately and more easily.

Still other objects and advantages of the invnetion will in part be obvious and will in part be apparent form the specification.

The invention accordingly comprises the features of construction, combinations of elements, and arrangement of parts which will be exemplified in the construction hereinafter set forth, and the scope of the invention will be indicated in the claims.

BRIEF DESCRIPTION OF THE DRAWINGS

FIG. 3 shows another embodiment of the multi-layer leadframe according to this invention, FIG. 3a being a partial plan view thereof and FIG. 3b being a sectional view taken along the line IIIB—IIIB of FIG. 3a, FIG. 4 shows a further embodiment of the multi-layer leadframe according to this invention, FIG. 4a being a partial plan view thereof and FIG. 4b being a sectional view taken along the IVB—IVB of FIG. 4a, FIG. 5 is a partial plan view of a still further embodiment of the multi-layer leadframe according to this invention, FIG. 13 shows a taping technique, FIG. 13a being a plan view thereof and FIG. 13b being a sectional view taken along the XIIIB—XIIIB of FIG. 13a.

DESCRIPTION OF THE PREFERRED EMBODIMENTS

Figure 1:
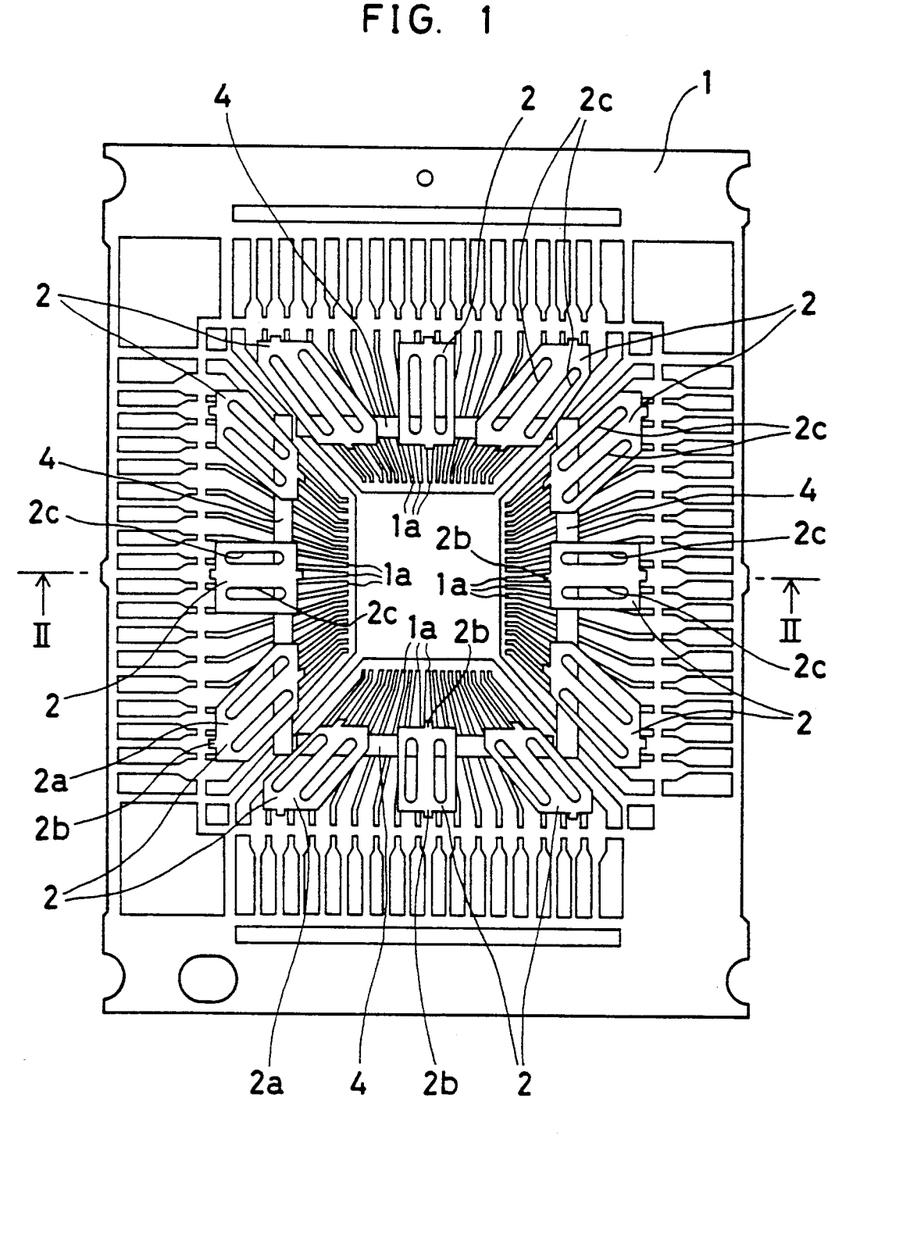
FIG. 1 is a plan view illustrating one embodiment of the multi-layer leadframe according to this invention.
Figure 2:
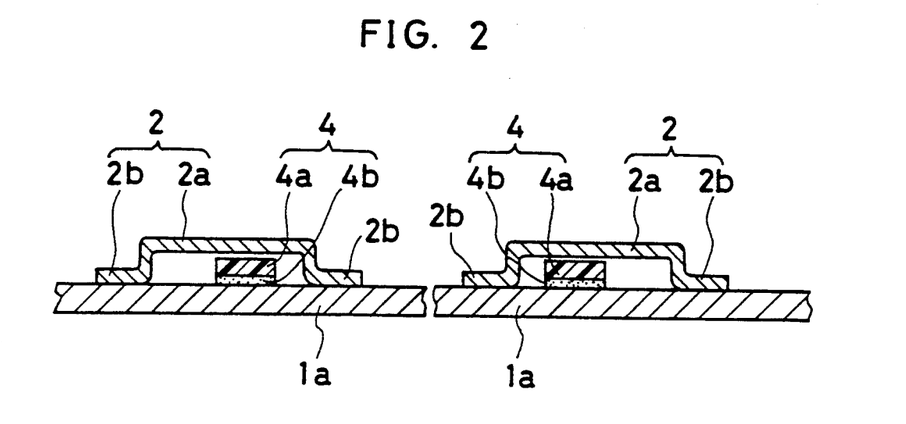
FIG. 2 is a sectional view taken along the line II—II of FIG. 1, showing one embodiment of the electrically conductive plate according to this invention, which is used with the multi-layer leadframe according to that example.

FIG. 1 is a plane view of one embodiment of the multi-layer leadframe according to this invention, and FIG. 2 is a sectional view taken along the line II—II of FIG. 1, showing one embodiment of the electrically conductive plate according to this invention, which is used with such a leadframe. It is noted that the same elements as used with a conventional example shown in FIGS. 12 and 13 are indicated by the same reference numerals, and so any explanation thereof will be omitted.

As shown in FIG. 1, a leadframe body 1 is a usual multi-pin, rather than multi-layer, leadframe body so far available and built up of a Cu or Fe-Ni based alloy having a thickness of, say, 0.10 to 0.25 mm. As is the case with a conventional leadframe shown in FIG. 13, this leadframe includes inner leads 1a which has previously been taped up, shown at 4, in a rectangular configuration, said tape 4 for taping purposes being formed of a base material 4a of 25 to 75 μm in thickness and an adhesive layer 4b of 20 to 30 μm in thickness. This tape 4 prevents deformation of the inner leads 1a and forms an insulating layer as well.

A given number (12 for the illustrated embodiment) of independent electrically conductive or power source plates 2, 2, . . . , are disposed on the inner leads 1a across the tape 4. As illustrated in FIGS. 1 and 2, each or the power source plate 2 is again formed of a Cu or Fe-Ni based alloy of 0.05 to 1.00 mm in thickness and built up of a planar portion 2a disposed across the tape 4 and two lead portions 2b and 2b projecting from the planar portion 2a in the direction along which each inner lead 1a extends. The planar portion 2a is relatively wide and provided with two elongated slots 2c and 2c.

The two lead portions 2b and 2b are pressed downwardly of the planar portion 2a, defining a step between the planar portion 2a and the lead portions 2b. Then, each lead portion is fixedly connected at 2b with one inner lead 1a with the tape 4 located between them. This connection may be achieved by any desired technique including electrical resistance welding, laser welding, brazing and soldering. While the power source plate 2 is fixed to the inner lead 1a, it is unlikely that the inner lead 1a connected with the lead portion 2b may come in contact with the adjacent inner lead 1a, because the planar portion 2a, even if relatively wide, is isolated from the inner lead 1a through the tape 4.

According to the thus constructed instant multi-layer leadframe wherein no close attention is needed to thermal and other influences in selecting adhesives, it is possible to connect the power source plates 2 with the inner leads 1a without recourse to a conventional expensive laminating adhesive film or tape 3 having adhesive layers 3b on both its sides, like one shown in FIG. 12. Hence, it is possible to prevent contamination which may otherwise be caused by outgassing of the adhesive 4b taking place during after-curing, as experienced so far. In addition, it is possible to achieve substantial cost reductions by dispensing with the costly laminating adhesive film or tape 3. Especially when what is improved of the inner leads 1a is only their inductance, it is possible to produce the multi-layer leadframe at much lower costs, because adhesives needing no after-curing can be used as those employed for taping.

Further, the power source plate 2 is connected with the inner lead 1a only at the lead portions 2b extending from the planar portion 2a; package cracking can be prevented from occurring due to a warp of the leadframe, unlike the conventional leadframe in which the power source plates 1 are bonded in place through the adhesive layers.

In addition, the two lead portions 2b and 2b of the power source plate 2 are connected with one inner lead 1a at two positions with an insulating layer located between them; a reduction in electrical inductance therebetween can be achieved.

Still further, because the power source plates 2, 2, . . . are independent from each other, the lead portion 2b can be connected with a desired inner lead 1a, thus enabling even a usual multi-pin, rather than multi-layer, leadframe body to cope with fast semiconductor elements.

Figures 3A, 3B:
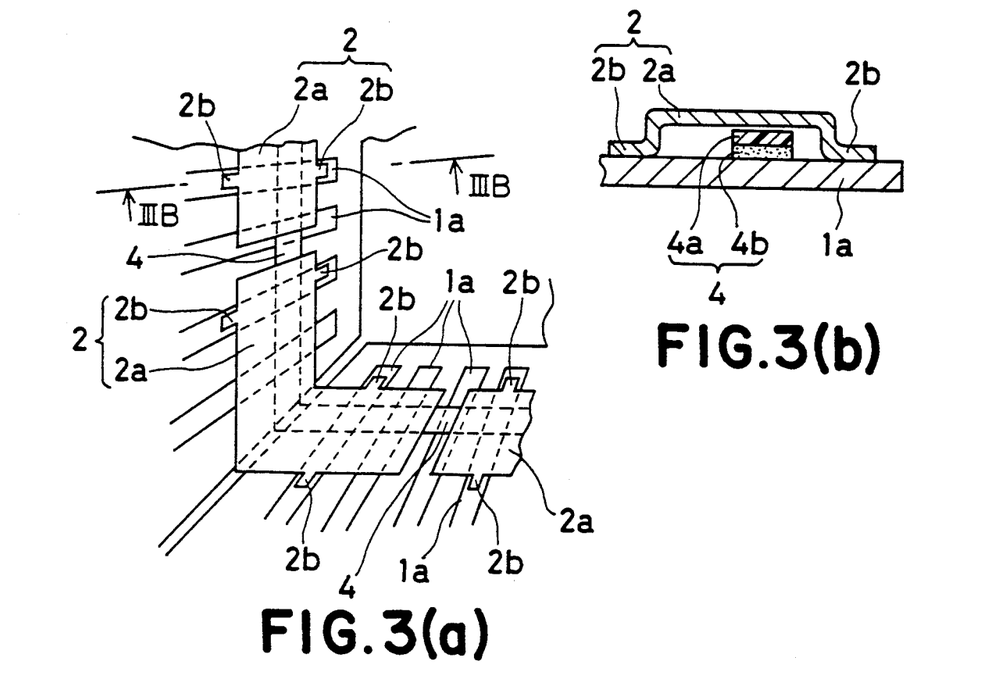

FIG. 3 shown another embodiment of this invention, FIG. 3a being a partial plan view thereof and FIG. 3b being a sectional view taken along the line IIIB—IIIB of FIG. 3a.

In the first embodiment, the given number of the power source plates 2, 2, . . . have been described as independent from each other. According to the second embodiment shown in FIG. 3, however, of such independent power source plates 2 shown in FIG. 1, two power source plates 2 adjacent to each other through their one corner edges are so integrally connected with each other that they depend upon each other. In other words, two pairs of lead portions 2b project from a set of the power source plates 2.

Other construction and action and effect of the instant multi-layer leadframe are equivalent to those referred to in connection with the first embodiment, and so will not be explained (this will hold for further embodiments). In the second embodiment, it goes without saying that the given number of the power source plates 2 may be all integrally connected together.

Figures 4A, 4B:
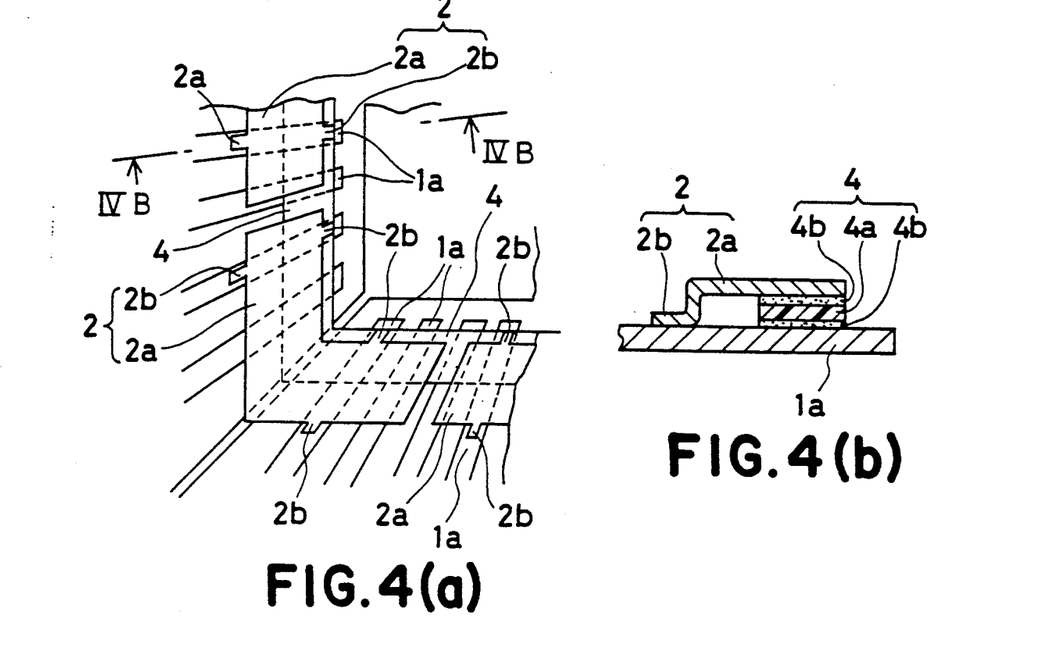

FIG. 4 is a view similar to FIG. 3, showing a further embodiment of this invention.

In the second embodiment shown in FIG. 3, the lead portions 2b, 2b, . . . located with the insulating layer of the tape 4 interposed therebetween have been all described as joined to the inner leads 1a. According to the third embodiment shown in FIG. 4, however, a lead portion 2b positioned at the leading side of an inner lead 1a is joined to a tape 4 that forms an insulating layer. The tape 4 used to this end may be built up of either a double-coated tape having adhesive layers on both its sides or a single adhesive layer. As is the case with the 1st and 2nd embodiments, the opposite lead portions 2b are joined to the inner leads 1a.

Such an arrangement is particularly effective when difficulty is expected to be involved in the welding of much finer inner leads, because it is possible to connect the inner leads 1a with power source plates 2 and the power source plates 2 with built-in semiconductor elements by wire bonding in a relatively easy manner.

Figure 5:
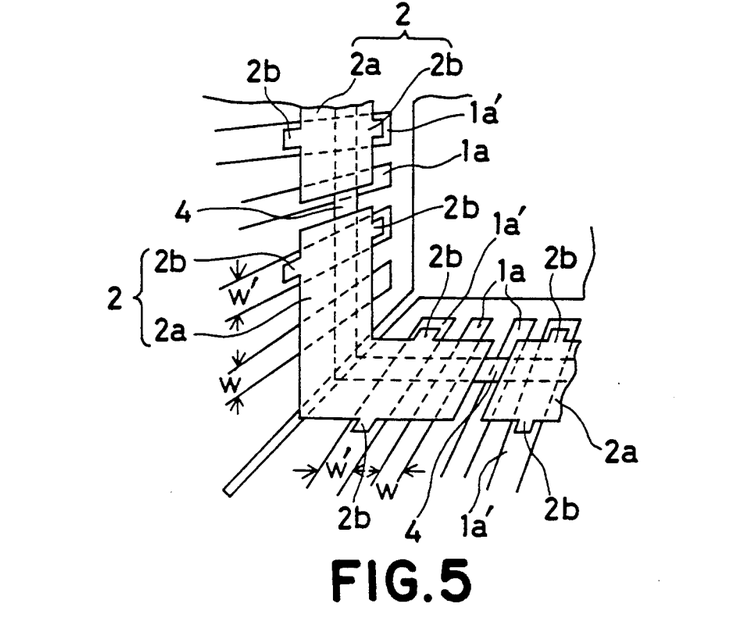

FIG. 5 is a view similar to FIG. 3a, showing a still further embodiment of this invention.

In the foregoing embodiments, all the inner leads 1a have been described as having a certain width w. According to the 4th embodiment shown in FIG. 5, however, the width w' of an inner lead 1a' having a lead portion 2b of a power source plate 2 joined thereto is larger than the width w of another inner lead 1a. The lead portions 2b can thus be made wider, making it possible to join the power source plates 2 with the inner leads 1a more firmly and stably.

Figure 6:
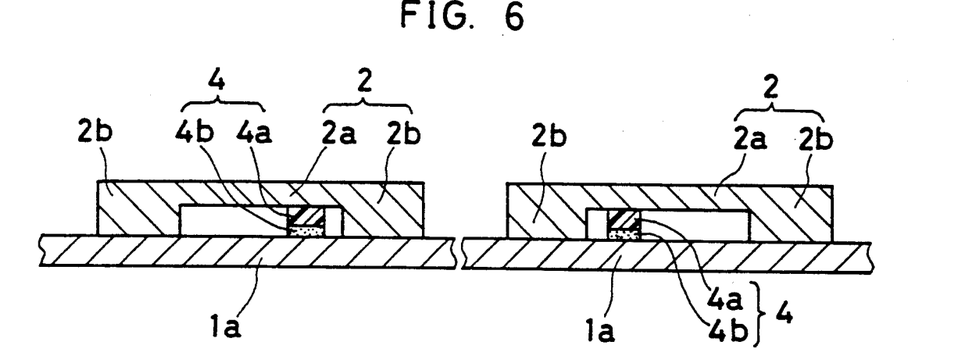
FIG. 6 is a sectional view taken along the line II—II of FIG. 1, showing another embodiment of the electrically conductive layer according to this invention.

FIG. 6 is a sectional view taken along the line II—II of FIG. 1, showing another embodiment of the electrically conductive plate according to this invention.

As illustrated in FIG. 6, a power source plate 2 forming this conductive plate including a planar portion 2a made thinner than connecting lead portions 26 by half-etching a metal plate having a certain material thickness from below. This etching renders it possible to form, with high accuracy, the regions of the lead portions 26 of the power source plate 2 needed for attachment to the inner lead 1a, with no fear of angular displacement of the power source plate 2. It is also possible to form the lead portions 2b by mere etching of the planar portion 2a, such press bending as needed so far can be dispensed with. In this connection, it is noted that the thickness and other geometrical factors of the planar portion 2a may be determined while taking its electrical properties into account.

Figure 7:
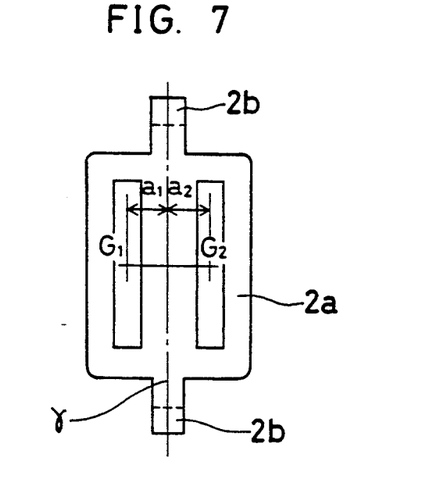
FIG. 7 is a plan view of the conductive plate shown in FIG. 6.

The geometry of the planar portion 2a is also determined such that the moments of the right and left segments of the planar portion 2a due to their own weights are kept well balanced with each other with respect to a common axial line $\gamma$ extending through the two connecting lead portions 2b and 2b. More exactly, the distribution of weight is required to satisfy the following equation:

$$G_1 \times a_1 = G_2 \times a_2$$

wherein
$G_1$ is the center of gravity of the left segment's own weight,
$a_1$ is the distance between $G_1$ and the axial line,
$G_2$ is the center of gravity of the right segment's own weight, and
$a_2$ is the distance between $G_2$ and the axial line.
In other words, the two connecting lead portions 2b and 2b are located at positions determined by the above-mentioned equation.

By forming the power source plate 2 in this manner, it can be set up and stabilized with respect to the axial line $\gamma$ extending through the two connecting lead portions 2b and 2b.

Figure 8:
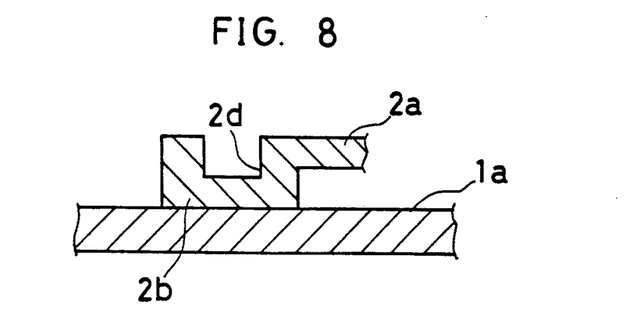
FIG. 8 is a partial section taken along the line II—II of FIG. 1, showing a further embodiment of the electrically conductive plate according to this invention.

FIG. 8 is a partial section of a connecting lead portion, shown a further embodiment of the electrically conductive plate according to this invention.

According to this embodiment, a connecting lead portion 2b is partially etched out, as shown at 2d, to thin the region thereof to be welded, thus making it possible to use laser welding.

Figure 9:
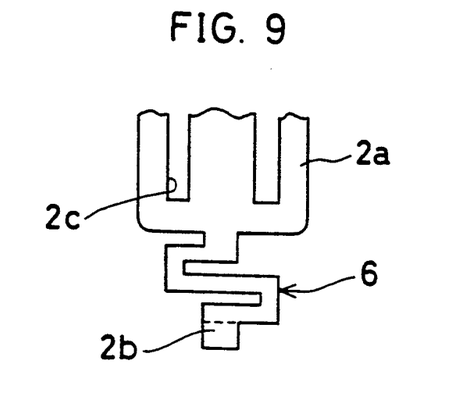
FIGS. 9–11 are partial plan views of still further embodiments of the conductive plate according to this invention.

FIG. 9 is a partial plan view showing a still further embodiment of the electrically conductive plate according to this invention.

As illustrated in FIG. 9, thermal stress absorber means 6 is located between planar and connecting lead portions 2a and 2b of a power source plate 2. This means 6 is provided in a zigzag form and designed to be substantially equal in thickness to the planar portion 2 by etching.

Such as when there is a difference in the thermal coefficient of expansion between a leadframe body 1 and the associated conductive plates 2, thermal equilibrium may be upset by various forms of heat including welding heat and heat semiconductor elements give out. However, such thermal disparity can be absorbed by this thermal stress absorber means 6.

Figure 10:
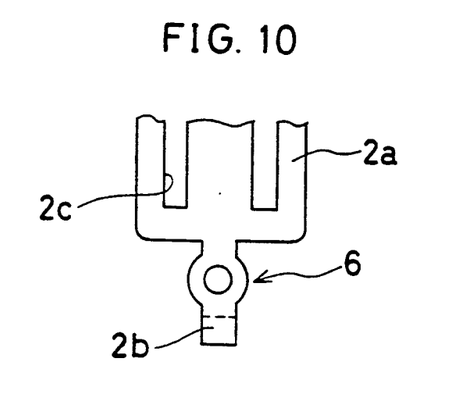
Figure 11:
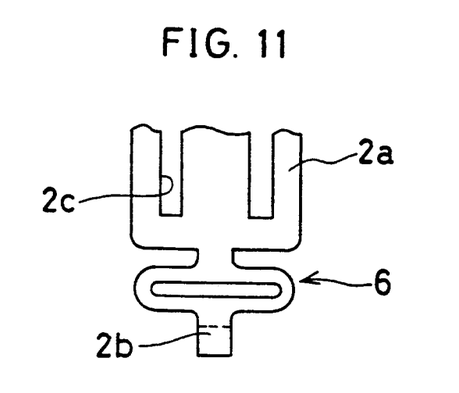

FIGS. 10 and 11 are each a partial plan view of a still further embodiment of the electrically conductive plate according to this invention.

While the thermal stress absorber means 6 has been described as provided in a zigzag form in the embodiment shown in FIG. 9, it may be provided in the form of a round hole or an elongated slot, as shown in FIG. 10 or 11.

It is understood that the thermal stress absorber means 6 is not limited in geometry to the above-mentioned zigzag, round hole or elongated slot form, and may take any desired form that can relieve stress.

It is understood that while the electrically conductive plates of this invention have been described as applied to the leadframe body 1 in the form of the power source plates 2 in the foregoing embodiments, the instant invention is equally applicable to other forms of conductive plates such as ground plates.

As appreciated from what has been described, the multi-layer leadframe according to this invention is less likely to warp, because the conductive plates are connected at the lead portions alone with the inner leads; this assures that package cracking by leadframe warping can be prevented. Because such expensive adhesives as used so far in the art can be dispensed with and adhesive portions can be decreased in number, it is possible to reduce contamination by gases outgassing from adhesives, thereby enhancing the reliability of the resulting multi-layer leadframe.

In addition, the multi-layer leadframe of this invention costs relatively little, because ordinary multi-pin leadframe bodies can be used.

According to the inventive conductive plate wherein its planar portion is made thin, on the other hand, it is possible to form connecting lead portions more accurately without recourse to press bending. Especially according to the present method for producing an electrically conductive plate wherein its planar portion is made thin by etching, demand for fine processing of the connecting lead portions can be met with certainty. In addition, it is possible to produce electrically conductive plates more accurately and more easily.

Furthermore, the inventive conductive plate can be set up and stabilized with respect to the axial line extending through two connecting lead portions, it is not only unlikely to fall down during positioning but can also be mounted on a leadframe body with no fear of angular displacement.

Still furthermore, thermal stress absorber means is provided between the planar and connecting lead portions of the conductive plate; this assures that disparity in thermal behavior caused as by welding can be absorbed.

Still furthermore, the inventive conductive plate can be built on a conventional multi-pin, rather than multi-layer, leadframe body; it is possible to form multi-layer leadframe more inexpensively.

By building the inventive conductive plates in leadframe bodies, it is thus possible to improve the productivity and reliability of multi-layer leadframes.

What is claimed is:

1. A multi-layer leadframe, comprising:
a plurality of outer leads electrically connected to an external circuit;
a plurality of inner leads provided continuous to these outer leads for electrical connection to a plurality of electrodes of a mounted semiconductor element through conductive wires;
an insulating layer bonded on said inner leads to extend across the inner leads to prevent deformation of the inner leads and contact between the inner leads themselves; and
an electrically conductive plate having a planar portion, a given number of lead portions protruding from the planar portion, said planar portion being arranged to stride over said insulating layer, a first one of said lead portions being fixedly connected on one side with respect to said insulating layer to a first one of said inner leads, and a second one of said lead portions being fixedly connected on the other side with respect to said insulating layer to said first one of said inner leads.

2. A multi-layer leadframe according to claim 1, wherein a third one of said lead portions is fixedly connected on one side with respect to said insulating layer to a second one of said inner leads, and a fourth one of said lead portions is fixedly connected on the other side with respect to said insulating layer to said second one of said inner leads.

3. A multi-layer leadframe according to claim 1, wherein the width of said first one of said inner leads where respective said lead portions are connected is larger than the width of another inner lead.

4. A multi-layer leadframe, comprising:
a plurality of outer leads electrically connected to an external circuit;
a plurality of inner leads provided continuous to these outer leads and electrically connected to a plurality of electrodes of a mounted semiconductor element through conductive wires;
an insulating layer bonded on said inner leads to extend across the inner leads to prevent deformation of the inner leads and contact between the inner leads themselves; and
an electrically conductive plate having a planar portion, a given number of lead portions protruding from the planar portion, said planar portion being arranged to stride over said insulating layer, a first one of said lead portions being fixedly connected on one side with respect to said insulating layer to a first one of said inner leads, and a second one of said lead portions is fixedly connected to said insulating layer.

5. A multi-layer leadframe according to claim 4, wherein a third one of said lead portions is fixedly connected on one side with respect to said insulating layer to a second one of said inner leads, and a fourth one of said lead portions is fixedly connected to said insulating layer.

6. A multi-layer leadframe according to claim 4, wherein the width of said first one of said inner leads where said first one of said lead portions is connected is larger than the width of another inner lead.

7. A multi-layer leadframe as claimed in claim 3, characterized in that said electrically conductive plate is a power source plate.

8. An electrically conductive plate used with a multi-layer leadframe as claimed in claim 3, characterized in that it comprises a planar portion and a given number of lead portions extending therefrom and at least partly connected with an inner lead of said leadframe body, said planar portion being smaller in thickness than said lead portions.

9. An electrically conductive plate as claimed in claim 8, characterized in that said given number of lead portions comprises two lead portions to be connected with the same inner lead.

10. An electrically conductive plate as claimed in claim 9, characterized in that said two lead portions are located such that the moments of right and left planar segments due to their own weights are equivalent to each other with respect to a common axial line extending therethrough.

11. An electrically conductive plate as claimed in claim 8, characterized in that thermal stress absorber means is provided between said lead portions and said planar portion.

12. An electrically conductive plate as claimed in claim 11, characterized in that said thermal stress absorber means is in a zigzag form or formed of a hole.

* * * * *